(12) United States Patent
Pal et al.

(10) Patent No.: US 12,622,025 B2
(45) Date of Patent: May 5, 2026

(54) SILICON CARBIDE TRANSISTOR WITH CHANNEL COUNTER-DOPING AND POCKET-DOPING

(71) Applicant: Applied Materials, Inc., Santa Clara, CA (US)

(72) Inventors: Ashish Pal, San Ramon, CA (US); Pratik B. Vyas, Fremont, CA (US); El Mehdi Bazizi, San Jose, CA (US); Stephen Weeks, Morrisville, VT (US); Ludovico Megalini, Mountain View, CA (US); Siddarth Krishnan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 389 days.

(21) Appl. No.: 18/160,949

(22) Filed: Jan. 27, 2023

(65) Prior Publication Data

US 2024/0258375 A1    Aug. 1, 2024

(51) Int. Cl.
*H10D 62/17*    (2025.01)
*H01L 21/04*    (2006.01)
(Continued)

(52) U.S. Cl.
CPC ......... *H10D 62/314* (2025.01); *H01L 21/046* (2013.01); *H10D 12/031* (2025.01); *H10D 62/8325* (2025.01)

(58) Field of Classification Search
CPC .............. H10D 62/314; H10D 12/031; H10D 62/8325; H10D 62/307; H01L 21/046
See application file for complete search history.

(56) References Cited

U.S. PATENT DOCUMENTS

2005/0017272 A1*   1/2005   Yamashita ........... H10D 64/685
                                          257/E29.104
2006/0223248 A1   10/2006   Venugopal et al.
(Continued)

FOREIGN PATENT DOCUMENTS

| JP | 2016015427 A | 1/2016 |
| KR | 20110094213 A | 8/2011 |
| KR | 20220119378 A | 8/2022 |

OTHER PUBLICATIONS

International Search Report with accompanying Written Opinion, issued on May 21, 2024, in corresponding International Application No. PCT/US2024/012401, 9 pages.
(Continued)

*Primary Examiner* — Mohammad A Rahman
(74) *Attorney, Agent, or Firm* — Kilpatrick Townsend & Stockton LLP

(57)    ABSTRACT

A silicon carbide transistor may be formed with a channel that includes a p-doped region between n-doped source and drain regions. A counter-doped region may be formed at the top of the channel directly underneath the gate oxide. Instead of using the conventional doping levels for the p-doped region, the doping concentration may be increase to be greater than about 1e18 cm³. The transistor may also include pocket regions on one or both sides of the channel. The pocket regions may be formed in the counter-doped region and may extend up to the gate oxide. These improvements individually and/or in combination may increase the current in the channel of the transistor without significantly increasing the threshold voltage beyond acceptable operating limits.

19 Claims, 10 Drawing Sheets

(51) Int. Cl.
    *H10D 12/01*         (2025.01)
    *H10D 62/832*      (2025.01)

(56)              References Cited

U.S. PATENT DOCUMENTS

| | | | |
|---|---|---|---|
| 2007/0090471 | A1 | 4/2007 | Cartier et al. |
| 2008/0203402 | A1* | 8/2008 | Endo .................... H10D 30/635 |
| | | | 257/E21.294 |
| 2015/0028348 | A1 | 1/2015 | Jacob et al. |
| 2015/0200253 | A1 | 7/2015 | Chen et al. |
| 2015/0249141 | A1 | 9/2015 | Yu et al. |
| 2023/0420451 | A1* | 12/2023 | Potera ................. H10D 12/031 |

OTHER PUBLICATIONS

Korean Patent Application No. 10-2025-7028539, "Office Action", Feb. 24, 2026, 18 pages.

* cited by examiner

200

202

Provide a silicon carbide layer

204

Implant a p-dopant in the silicon carbide layer to form a p-doped region

206

Implant an n-dopant in the silicon carbide layer to form a counter-doped region of n-doped silicon carbide

208

Implant a first p-doped pocket region

210

Implant a second p-doped pocket region

Current gain and Vt shift using pocket doping with counter-doped channel

SILICON CARBIDE TRANSISTOR WITH CHANNEL COUNTER-DOPING AND POCKET-DOPING

TECHNICAL FIELD

This disclosure generally describes channel doping for silicon carbide transistors. More specifically, this disclosure describes channel doping concentrations and/or pocket implants for improving mobility and channel current while maintaining a low threshold voltage.

BACKGROUND

Silicon carbide transistors offer an alternative to traditional metal-oxide-silicon field-effect transistors (MOSFETs). For example, silicon carbide transistors may be used in applications that require higher blocking voltage, lower on-state resistance, and/or higher thermal conductivity. These advantages may stem from the material advantages that are inherent in the physics of silicon carbide. Like traditional MOSFETs, silicon carbide transistors may include gate, drain, and source components that function in a similar manner. Recently, further improvements have been realized in silicon carbide transistors to improve mobility in the transistor channel. Specifically, an n-type counter-doped region in the channel may ne formed to work together with a relatively low-doped p-well. This counter-doped region causes the channel to form further away from the surface of the gate oxide to form a buried-channel device. However, while counter-doping a thin region of the channel may increase the mobility in the channel, it also dramatically increases the leakage current. Therefore, improvements in the art are needed.

SUMMARY

In some embodiments, a silicon carbide transistor may include a source region, a drain region, a gate oxide, and a channel region between the source region and the drain region and beneath the gate oxide. The channel region may include a p-doped silicon carbide region that is doped at a concentration greater than about 1e18 cm3. The channel region may also include a counter-doped region comprising n-doped silicon carbide, where the counter-doped region may be between the p-doped silicon carbide region and the gate oxide.

In some embodiments, a silicon carbide transistor may include a source region, a drain region, a gate oxide, and a channel region between the source region and the drain region and beneath the gate oxide. The channel region may include a p-doped silicon carbide region beneath the gate oxide. The channel region may also include a counter-doped region comprising n-doped silicon carbide, where the counter-doped region may be between the p-doped silicon carbide region and the gate oxide. The channel region may also include a first p-doped pocket region between the source region and the counter-doped region, and a second p-doped pocket region between the drain region and the counter-doped region.

In some embodiments, a method of forming a channel region for a silicon carbide transistor may include providing a silicon carbide layer. The method may also include implanting a p-dopant in the silicon carbide layer to form a p-doped region that is doped at a concentration greater than or about 1e18 cm3 between a source region and a drain region. The method may further include implanting an n-dopant in the silicon carbide layer to form a counter-doped region including n-doped silicon carbide between the source region and the drain region, where the counter-doped region is on top of the p-doped region.

In any embodiments, any and all of the following features may be implemented in any combination and without limitation. The counter-doped region may be doped at a concentration that is less than about 1e18 cm$^3$. The channel region may have a length of about 10 μm. The counter-doped region and doping concentration of the a p-doped silicon carbide region may cause a threshold voltage of the silicon carbide transistor to increase by less than or about 3V. The counter-doped region and doping concentration of the a p-doped silicon carbide region may cause a drive current to increase by more than or about 70%. The first p-doped pocket region and the second p-doped pocket region may contact the gate oxide. The first p-doped pocket region and the second p-doped pocket region need not contact the p-doped silicon carbide region. The first p-doped pocket region and the second p-doped pocket region may have a vertical depth that is about half of a vertical depth of the counter-doped region. The first p-doped pocket region and the second p-doped pocket region may have a horizontal length of between about 0.5 nm and about 2.0 nm. The first p-doped pocket region and the second p-doped pocket region may have a vertical depth that between about 0.5 μm and about 1.0 μm. The first p-doped pocket region may contact the source region and the counter-doped region. The second p-doped pocket region may contact the drain region and the counter-doped region. The method may also include implanting a first p-doped pocket region between the source region and the counter-doped region, and implanting a second p-doped pocket region between the drain region and the counter-doped region. The method may also include determining a length and depth of the first p-doped pocket region and the second p-doped pocket region to produce a target threshold voltage shift and drive current gain. The method may also include determining a doping concentration of the first p-doped pocket region and the second p-doped pocket region to produce a target threshold voltage shift and drive current gain.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Described herein are embodiments for a silicon carbide transistor with low threshold voltage and increased drive current. A silicon carbide transistor may be formed with a channel that includes a p-doped region between n-doped source and drain regions. A counter-doped region may be formed at the top of the channel directly underneath the gate oxide. Instead of using the conventional doping levels for the p-doped region, the doping concentration may be increase to be greater than about 1e18 cm3. The transistor may also include pocket regions on one or both sides of the channel. The pocket regions may be formed in the counter-doped region and may extend up to the gate oxide. These improvements individually and/or in combination may increase the current in the channel of the transistor without significantly increasing the threshold voltage beyond acceptable operating limits.

Figure 1:
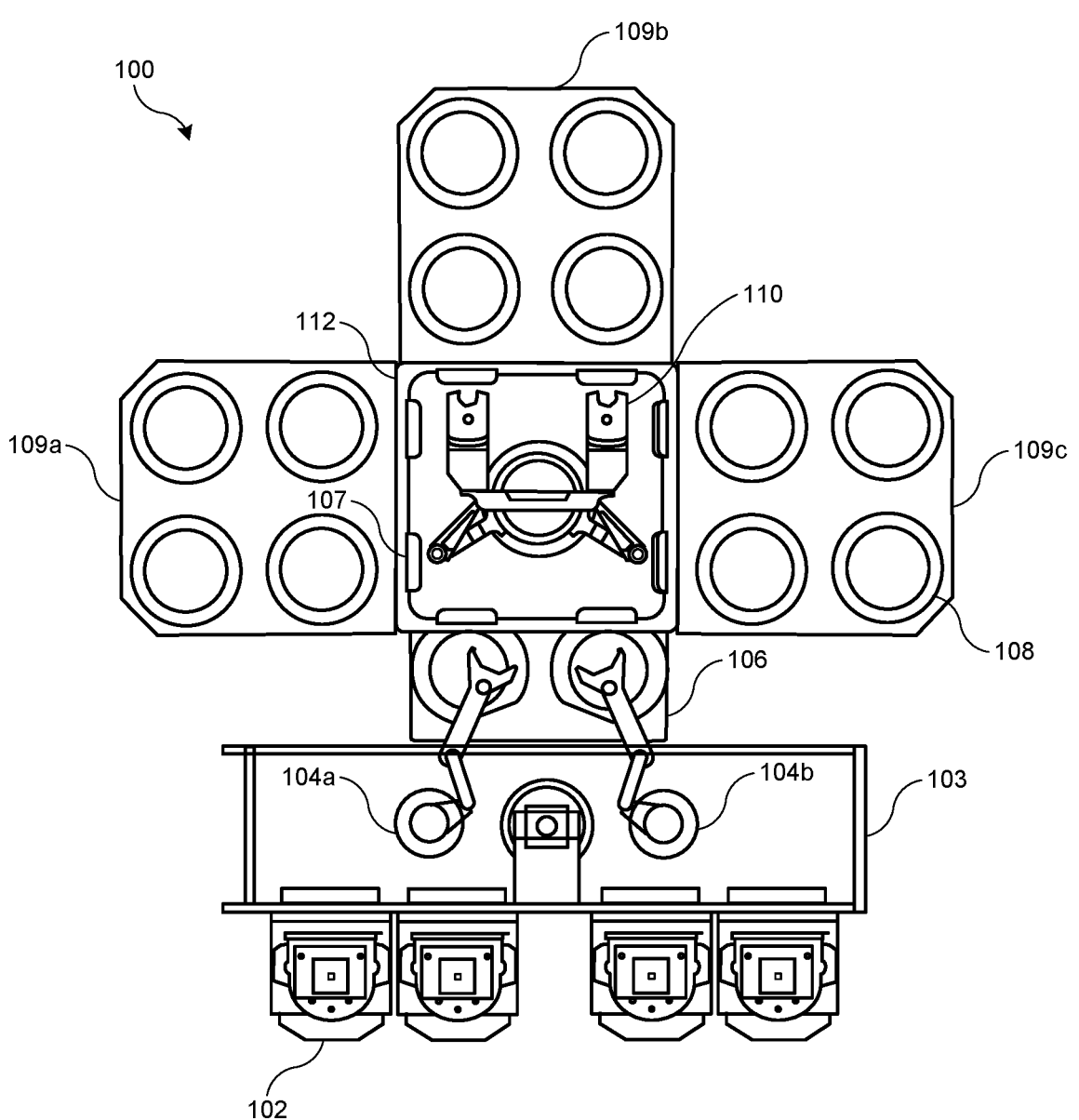
FIG. 1 illustrates a top plan view of a substrate processing tool or processing system of deposition, implanting, etching, baking, and curing chambers, according to some embodiments.

FIG. 1 illustrates a top plan view of a substrate processing tool or processing system 100 of deposition, implanting, etching, baking, and curing chambers, according to some embodiments. A set of front-opening unified pods 102 may supply substrates of a variety of sizes that are received within a factory interface 103 by robotic arms 104*a* and 104*b* and placed into a load lock or low pressure holding area 106 before being delivered to one of the substrate processing regions 108, positioned in chamber systems or quad sections 109*a-c*, which may each be a substrate processing system having a transfer region fluidly coupled with a plurality of processing regions 108. Although a quad system is illustrated, it is to be understood that platforms incorporating standalone chambers, twin chambers, and other multiple chamber systems may also be used. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109*a* and 109*b*, may be used to deposit material on the substrate, and the third set of processing chambers, such as the processing chambers or regions in quad section 109*c*, may be used to cure, anneal, or treat the deposited films. In another configuration, all three sets of chambers, such as all twelve chambers illustrated, may be configured to both deposit and/or cure a film on the substrate.

The second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, implantation, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Silicon carbide transistors offer an alternative to traditional metal-oxide-silicon field-effect transistors (MOSFETs). For example, silicon carbide transistors may be used in applications that require higher blocking voltage, lower on-state resistance, and/or higher thermal conductivity. These advantages may stem from the material advantages that are inherent in the physics of silicon carbide. Like traditional MOSFETs, silicon carbide transistors may include gate, drain, and source components that function in a similar manner. Recently, further improvements have been realized in silicon carbide transistors to improve mobility in the transistor channel. Specifically, an n-type counter-doped region in the channel may be formed to work together with a relatively low-doped p-well. This counter-doped region causes the channel to form further away from the surface of the gate oxide and form a buried-channel device. However, while counter-doping a thin region of the channel region may increase the mobility in the channel, it degrades the leakage current of the transistor. For example, increasing the threshold voltage causes higher leakage currents and requires a higher standby power consumption in many applications. Compensating for the threshold voltage loss may require additional processes and complex circuitry.

The embodiments described herein solve these and other technical problems by providing a silicon carbide transistor design that provides increased mobility, decreased on-resistance, and increased channel current while still maintaining a low operating threshold voltage. A silicon carbide transistor may be formed with a channel that includes a p-doped region between n-doped source and drain regions. A counter-doped region may be formed at the top of the channel directly underneath the gate oxide. However, instead of using the conventional doping levels for the p-doped region, these embodiments may increase the doping concentration to be greater than about 1e18 cm³, which is considerably higher than the doping concentrations of existing designs. Some embodiments may further improve the performance of the transistor by including pocket regions on one or both sides of the channel. Pocket regions may be formed in the counter-doped region and may extend up to the gate oxide. These improvements individually and/or in combination may increase the current in the channel of the transistor without significantly increasing the threshold voltage beyond acceptable operating limits.

Figure 2:
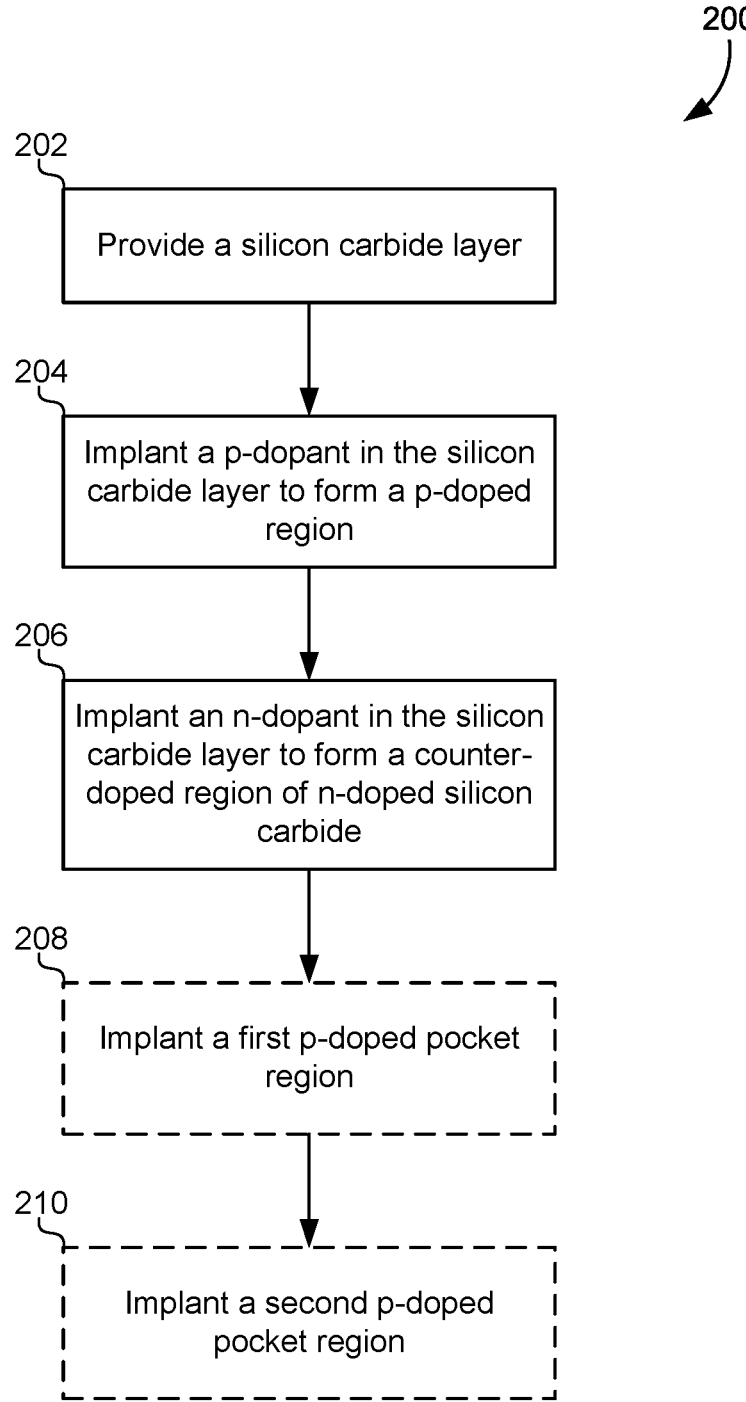
FIG. 2 illustrates a flowchart of a method for forming a silicon carbide transistor channel with improved mobility and threshold voltage, according to some embodiments.
Figure 3A:
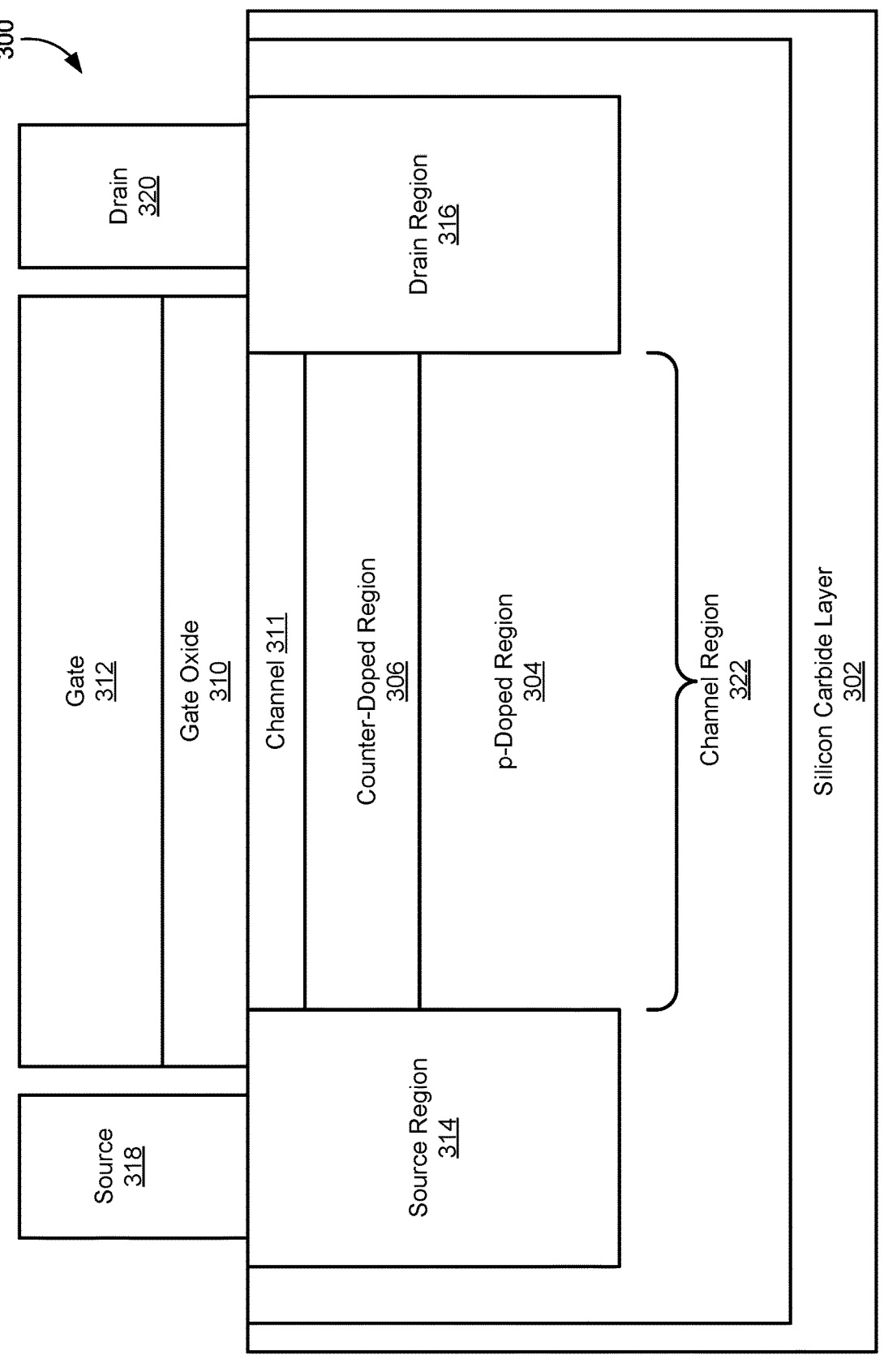
FIG. 3A illustrates a silicon carbide transistor with a counter-doped region, according to some embodiments.
Figure 3B:
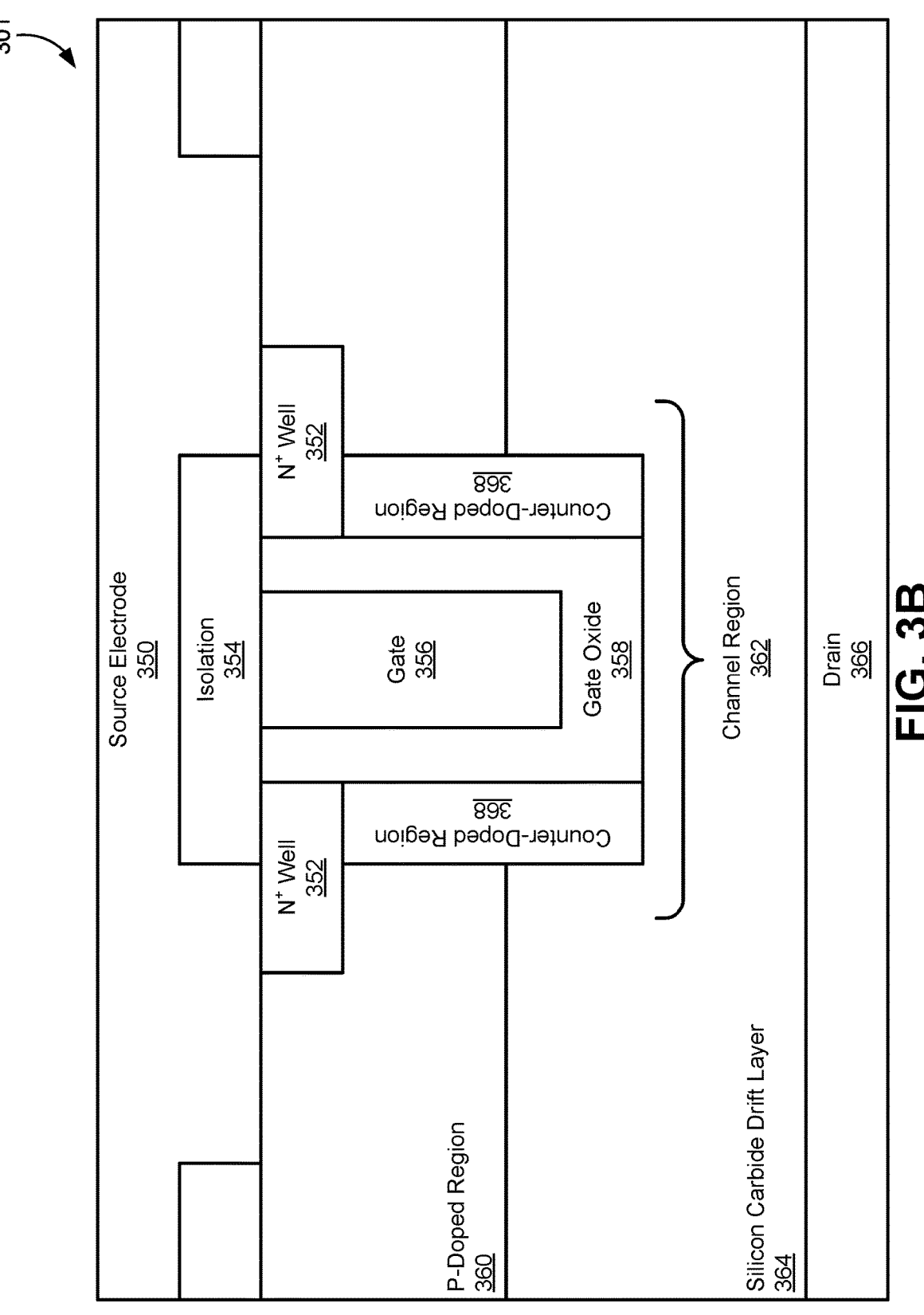
FIG. 3B illustrates a silicon carbide trench transistor with a counter-doped region, according to some embodiments.
Figure 4A:
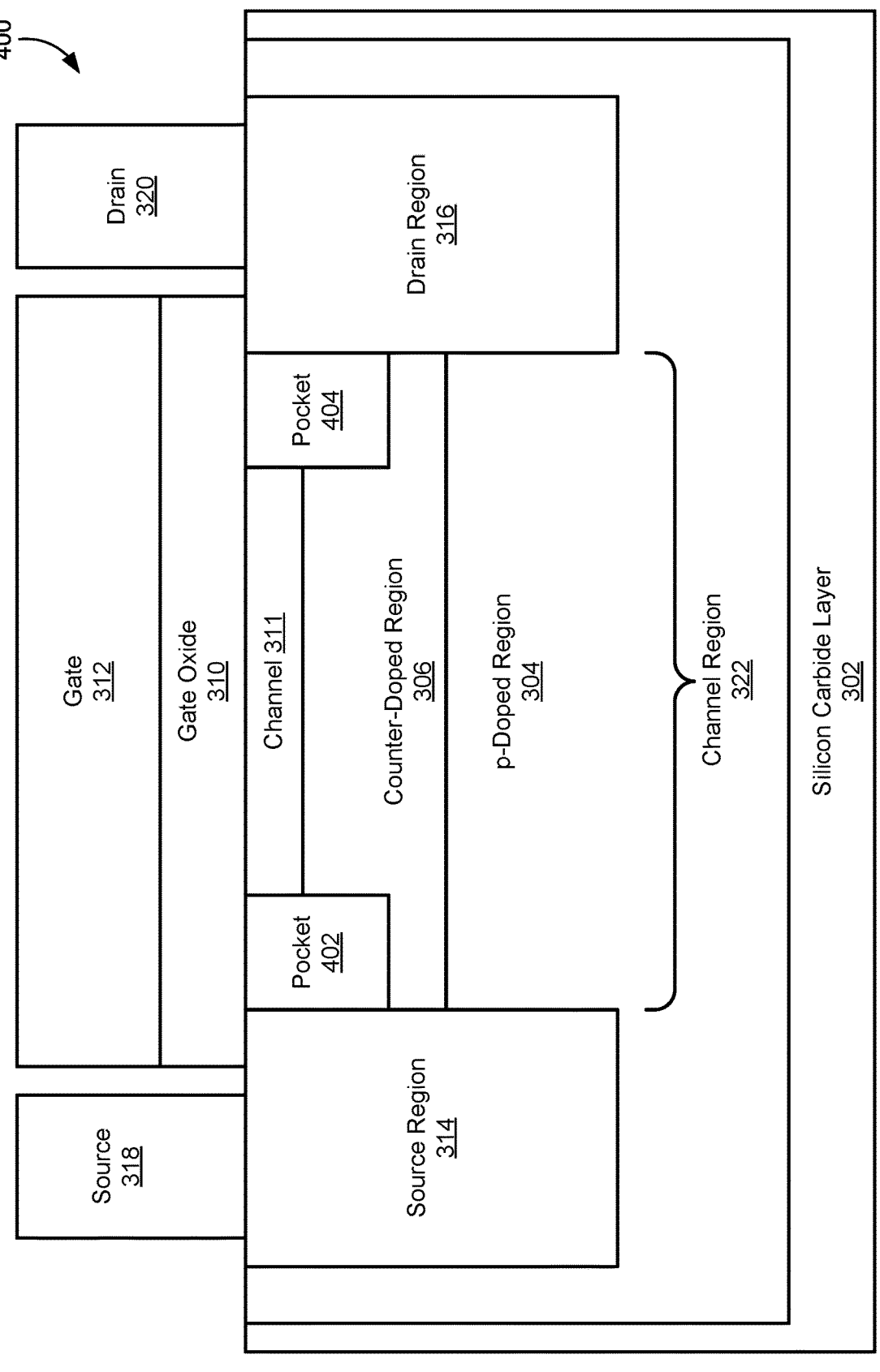
FIG. 4A illustrates a silicon carbide transistor with pocket implants, according to some embodiments.
Figure 4B:
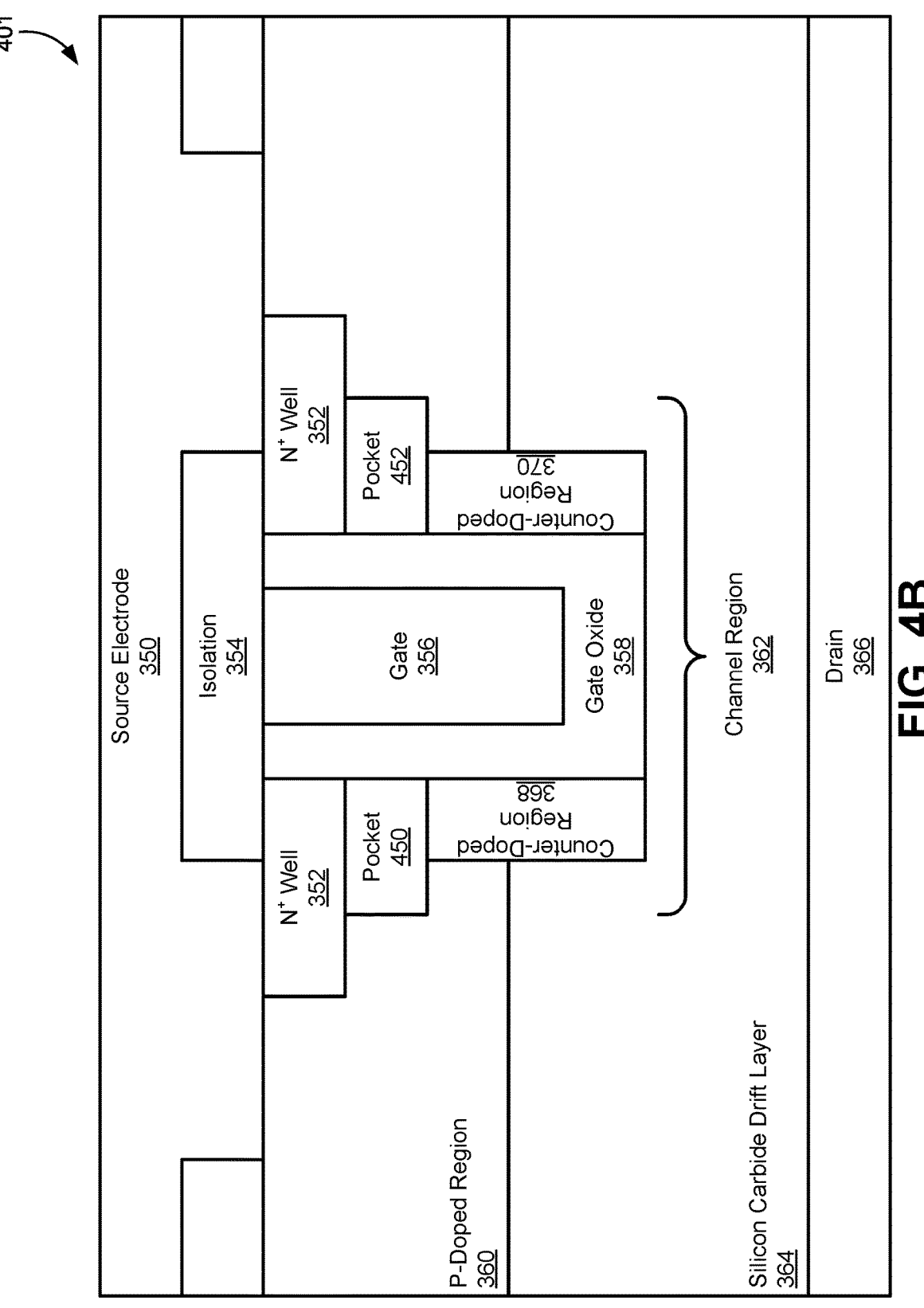
FIG. 4B illustrates a silicon carbide trench transistor 401 with pocket implants, according to some embodiments.

FIG. 2 illustrates a flowchart 200 of a method for forming a silicon carbide transistor channel with improved mobility and threshold voltage, according to some embodiments. Many operations of flowchart 200 may be performed, for example, in the processing system 100 as previously described. The method of flowchart 200 may include one or more operations prior to the initiation of the method, including front end processing, deposition, etching, polishing, cleaning, or any other operations that may be performed prior to the described operations. The method may include a number of optional operations as denoted in the figure, which may or may not be specifically associated with some embodiments. For example, many of the operations are described in order to provide a broader scope of the structural formation, but are not critical to the technology, or may be performed by alternative methodology as will be discussed further below. Flowchart 200 describes operations shown structurally in FIGS. 3A-3B and FIGS. 4A-4B, the illustrations of which will be described in conjunction with the operations of the method of flowchart 200. It is to be understood that FIGS. 3-4 illustrate only partial structural views, and a substrate may contain any number of semiconductor sections having aspects as illustrated in the figures, as well as alternative structural aspects that may still benefit from aspects of the present technology. For example, flowchart 200 does not describe the explicit formation of gate, source, and/or drain regions, as these regions may be formed using conventional techniques in combination with the novel channel design described below.

This method may include various steps that are carried out in any sequence to form a silicon carbide transistor structure. Non-limiting examples of the silicon carbide transistors that may be formed from this method are illustrated below in FIGS. 3A-3B and FIGS. 4A-4B. Therefore, as the various processing steps in flowchart 200 are described, reference may be made to the resulting transistor structures illustrated in FIGS. 3A-3B and FIGS. 4A-4B. Note that this method focuses specifically on the formation of the transistor channel instead of the source region, drain region, gate oxide, and/or other transistor components. These additional transistor components may be formed using traditional techniques that are not described herein in detail. These additional components may be formed at any stage of the method of flowchart 200. For example, the source region and/or drain region may be formed before or after the transistor channel.

The method may include providing a silicon carbide layer (202). The silicon carbide layer may act as a base on which one or more silicon carbide transistors and other semiconductor structures are formed. Although the examples described herein show a single silicon carbide transistor structure, this single structure is provided only by way of example and is not meant to be limiting. In practice, the silicon carbide layer may include a plurality of transistors arranged in various patterns, along with other semiconductor circuits and/or structures. The silicon carbide layer may include a layer of silicon carbide deposited on an underlying substrate. Alternatively, the substrate itself may be formed from silicon carbide (e.g., instead of conventional silicon).

The method may also include implanting a p-dopant in the silicon carbide layer to form a p-doped region (204). FIG. 3A illustrates a silicon carbide transistor 300 with a counter-doped region 304, according to some embodiments. The silicon carbide transistor 300 may include a silicon carbide layer 302 as described above. A p-doped region 304 may be formed in the silicon carbide layer 302 by implanting a p-dopant into the silicon carbide layer 302. For example, some embodiments may use an implant process to dope the silicon carbide layer 302 with a dopant such as aluminum. The p-doped region 304 may also commonly be referred to as a p-well. The p-doped region 304 may extend to a depth below a source region 314 and/or a drain region 316. The source region 314 and/or the drain region 316 may be formed by implanting an n-dopant such as nitrogen in the silicon carbide layer 302. The p-doped region 304 may also extend laterally beyond the vertical edges of the source region 314 and/or the drain region 316 such that the source region 314 and/or the drain region 316 are formed entirely within the p-doped region 304 as illustrated in FIG. 3A.

The method may also include implanting an n-dopant in the silicon carbide layer 302 to form a counter-doped region (206). As illustrated in FIG. 3A, the counter-doped region 306 may include n-doped silicon carbide between the source region 314 and the drain region 316. The counter-doped region 306 may also be located directly beneath a gate oxide 310. For example, the counter-doped region 306 may be located between the gate oxide 310 and the p-doped region 304 within the channel. In some embodiments, the counter-doped region 306 may directly contact the gate oxide 310 such that no intermediate layer is between the counter-doped region 306 and the gate oxide 310. The counter-doped region 306 may be doped using any type of n-dopant, such as nitrogen or other similar materials. When forming the counter-doped region 306, the n-dopant may be implanted in the p-doped region 304 to form the counter-doped region 306. Together, the portion of the p-doped region 304 and the counter-doped region 306 between the source region 314 and the drain region 316 may form the channel region 322 of the silicon carbide transistor 300. When a sufficient gate voltage is applied to a gate 312 of the silicon carbide transistor 300, a conductive channel may form in the channel region 322.

Some embodiments may further include forming a shallow channel 311 in the counter-doped region 306. The channel 311 may be formed by applying a p-dopant to the counter-doped region 306 for a concentration of approximately $1e15$ cm³ to $1e17$ cm³. The depth of the channel 311 may be between about 20 nm and about 100 nm.

The silicon carbide transistor 300 may also include a source 318 and a drain 320, which may be formed from any conductive material to provide electrode contacts to the silicon carbide transistor 300. A gate oxide 310 may be formed from any oxide or insulating material, such as silicon oxide. The gate 312 may be formed on top of the silicon oxide 310 using existing techniques. Various dimensions may be used for any of the regions and components of the silicon carbide transistor 300. By way of example, a length of the gate 312 and/or a length of the channel region 322 may be between about 8 μm and about 15 μm (e.g., about 10 μm), depending on the embodiment.

Adding the counter-doped region 306 alone with a relatively low level of doping in the p-doped region 304 may dramatically increase the normalized drive current through the silicon carbide transistor 300. For example, some transistor configurations with a counter-doped region 306 may use a doping concentration of less than about $1e17$ cm³ for the p-doped region 304. This level of doping may increase the drive current through the silicon carbide transistor 300 by as much as a factor of 8. In fact, this lower level of doping in the p-doped region 304 has generally been used precisely because it increases the drive current through the transistor. However, increasing the drive current by adding the counter-doped region 306 with a low-level p-doped region 304 also increases the threshold voltage to operate the transistor. For example, a doping concentration of less than about $1e17$ cm³ for the p-doped region 304 may result in a threshold voltage of about −10V to operate the silicon carbide transistor 300. This relatively high threshold voltage may preclude the use of the silicon carbide transistor 300 in certain applications despite the increase in drive current.

To solve this technical problem, some embodiments may increase the doping concentration of the p-doped region 304 when used in combination with the counter-doped region 306. For example, some embodiments may increase the doping concentration of for the p-doped region 304 to be greater than or about $1e18$ cm³. This higher doping concentration in the p-doped region 304 may still increase the drive current by a factor of about 1.7 (i.e., a 70% increase in performance compared to embodiments with lower doping levels), while only increasing the threshold voltage to about −3V. This provides a silicon carbide transistor 300 with an increase in the drive current that corresponds to a much lower increase in the threshold voltage. Thus, these designs may be compatible with a larger number of applications, may result in less leakage current and lower power operation, and may be easier to integrate in various on-chip systems.

Doping levels greater than or about $1e18$ cm³ for the p-doped region 304 have not been used prior to this disclosure because of the reduction in mobility and drive current in the channel region. However, it has been discovered that these higher doping concentrations may still produce moderate gains in drive current while significantly reducing the threshold voltage increase.

As described above, some embodiments may use doping levels greater than or about $1e18$ cm³ for the p-doped region 304 with various thresholds and/or intervals. For example, some embodiments may use doping levels of between about $1e18$ cm³ and about $2e18$ cm³, between about $2e18$ cm³ and about $3e18$ cm³, between about $3e18$ cm³ and about $4e18$ cm³, between about $4e18$ cm³ and about $5e18$ cm³, between about $5e18$ cm³ and about $6e18$ cm³, between about $6e18$ cm³ and about $7e18$ cm³, between about $7e18$ cm³ and about $8e18$ cm³, between about $8e18$ cm³ and about $9e18$ cm³, between about $9e18$ cm³ and about $1e19$ cm³, between about $1e19$ cm³ and about $2e19$ cm³, between about $2e19$ cm³ and about $3e19$ cm³, between about $3e19$ cm³ and about $4e19$ cm³, between about $4e19$ cm³ and about $5e19$ cm³, between about $5e19$ cm³ and about $6e19$ cm³, between about $6e19$ cm³ and about $7e19$ cm³, between about $7e19$ cm³ and about $8e19$ cm³, between about $8e19$ cm³ and about $9e19$ cm³, between about $9e19$ cm³ and about $1e20$ cm³, or greater than about $1e20$ cm³. Some embodiments may place an upper limit on the doping level to minimize the reduction in drive current.

In addition to the silicon carbide transistor 300 illustrated in FIG. 3A, the method of flowchart 200 may also be used to form an silicon carbide trench transistor. FIG. 3B illustrates a silicon carbide trench transistor 301 with a counter-doped region 370, according to some embodiments. The silicon carbide trench transistor 301 may include a silicon carbide drift layer 364. A p-doped region 360 may be formed in the silicon carbide layer 364 by implanting a p-dopant into the silicon carbide layer 364. For example, some embodiments may use an implant process to dope the silicon carbide layer 364 with a dopant such as aluminum. The p-doped region 360 may also commonly be referred to as a p-well. The p-doped region 360 may extend to a depth below a source electrode 350.

The silicon carbide trench transistor 301 may also include an isolation region 354. The isolation region 354 may extend laterally above a gate 356 surrounded by a gate oxide 358. The gate 356 may be formed as a trench in the p-doped region 360 and the silicon carbide drift layer 364. The trench may be lined with the gate oxide 358. N-wells may be formed by implanting an n-dopant such as nitrogen in the p-doped region 360.

As described above, the method may also include implanting an n-dopant in the silicon carbide layer 364 and/or the p-doped region 360 to form a counter-doped region 368 (206). As illustrated in FIG. 3B, the counter-doped region 368 may include n-doped silicon carbide that lines the trench for the gate 356. For example, a trench may be formed in the p-doped region three and 60 and/or the silicon carbide drift layer 364. The lining of the trench may then be doped with the n-dopant to form the counter-doped region 368. The trench may then be lined with the gate oxide 358 and filled with the material for the gate 356. The counter-doped region 368 may be located directly beneath the N-wells 352. In some embodiments, the N-wells 352 may extend laterally beyond the counter-doped region 368 and/or beyond the isolation region 354. In some embodiments, the N-wells 352 may be formed such that they directly contact the counter-doped region 368 and/or may directly contact the gate oxide 358 such that no intermediate layer is between the N-wells 352 and/or the gate oxide 358. Other embodiments may allow intermediate layers. Some embodiments may also provide a recess between the counter-doped region 368 and the N-wells 352. These gaps may be filled with the P-doped region 360, or may alternatively be filled with the pocket implants described below. The counter-doped region may extend past the bottom of the pre-doped region 360, yet may end before the bottom of the gate oxide 358. Alternatively, as shown in FIG. 3B, the counter-doped region 368 may extend into the bottom of the gate oxide 358, and may extend beyond the bottom of the gate oxide 358 in some embodiments.

The counter-doped region 368 may be doped using any type of n-dopant, such as nitrogen or other similar materials. When forming the counter-doped region 368, the n-dopant may be implanted in the p-doped region 360 to form the counter-doped region 360. Together, the portion of the p-doped region 360, the counter-doped region 368, and the silicon carbide drift layer 364 between the source electrode 350 and the drain 366 may form the channel region 362 of the silicon carbide trench transistor 301. When a sufficient gate voltage is applied to a gate 356 of the silicon carbide trench transistor 301, a conductive channel may form in the channel region 362. The doping levels of the p-doped region 360 and the counter-doped region 368 may be the same or similar as described above for the silicon carbide transistor 300. The counter-doped region 368 and the relative doping of the P-doped region 360 may also be used as described above to produce a similar advantageous effect.

In addition to increasing the doping concentration, some embodiments may further improve the operation of the silicon carbide transistor 300 by adding pocket implants at one or both sides of the counter-doped region 306. Therefore, the method of flowchart 200 may also optionally include implanting a first p-doped pocket region (208) and/or implanting a second p-doped pocket region (210). FIG. 4A illustrates a silicon carbide transistor 400 with pocket implants, according to some embodiments. For illustrative purposes only, the silicon carbide transistor 400 may include many of the same regions and components illustrated above in the silicon carbide transistor 300 of FIG. 3A. For example, the silicon carbide transistor 400 may include a silicon carbide layer 302, a p-doped region 304, a counter-doped region 306, a source region 314, a drain region 316, a source 318, a drain 320, a gate oxide 310, a gate 312, channel region 322, and so forth.

Additionally, the channel region 322 may further include a first pocket region 402 and/or a second pocket region 404. The first pocket region 402 and/or the second pocket region 404 may be formed by implanting a p-dopant in the silicon carbide of the counter-doped region 306. For example, a p-dopant such as aluminum may be implanted in the first pocket region 402 and/or the second pocket region 404. These pocket regions may act as a potential barrier to the electron flow. It has been discovered that forming this potential barrier may recover a portion of the threshold voltage loss caused by adding the counter-doped region 306.

It should be noted that the first pocket region 402 and the second pocket region 404 differ significantly from previous features in silicon transistors that may have also been referred to as "halo" implants or regions. For example, traditional halo implants in silicon transistors were typically formed around the bottoms of the source and drain regions to prevent punch-through and leakage current between the source/drain depletion regions. These halo implants were conventionally located below the channel of current flow along the lower edges or corners of the source and drain regions. Previous halo implants did not extend up to the gate oxide and did not extend into the counter-doped region of the channel if such a region was present.

In contrast to the halo implants of silicon transistors, the pocket regions 402, 404 of the silicon carbide transistor 400 may be formed between the source and drain regions and the counter doped region. For example, the first pocket region 402 may be formed between the source region 314 and the counter doped region 306, while the second pocket region 404 may be formed between the drain region 316 and the counter-doped region 306. Therefore, the pocket regions 402, 404 differ from the halo implants of silicon transistors in both location and purpose.

In some embodiments, the pocket regions 402, 404 may extend upwards to contact the gate oxide 310. In some embodiments, the pocket regions 402, 404 may not extend below the counter-doped region 306, thereby not extending into the p-doped region 304. For example, the pocket regions 402, 404 may extend down approximately halfway through a depth (i.e., the vertical dimension of FIG. 4A) of the counter-doped region 306. A counter-doped region 306 with a depth of approximately 200 nm may include pocket regions 402, 404 with a depth of approximately 100 nm. As described below in FIG. 7, varying the depth of the pocket regions 402, 404 may be used to adjust the trade-off between the drive current and the threshold voltage. Similarly, as described below in FIG. 8, varying the length of the pocket regions 402, 404 in the horizontal dimension of FIG. 4A may also be used to a further adjust this trade-off.

FIG. 4B illustrates a silicon carbide trench transistor 401 with pocket implants, according to some embodiments. For illustrative purposes only, the silicon carbide trench transistor 401 may include many of the same regions and components illustrated above in the silicon carbide trench transistor 301 of FIG. 3B. For example, the silicon carbide trench transistor 401 may include a source electrode 350, a drain 366, an isolation region 354, N-wells 352, a counter-doped region 368 surrounding a gate oxide 358 and a gate 356, a p-doped region 360, a silicon carbide drift layer 364, a channel region 362, and/or other features.

Additionally, the channel region 362 may further include a first pocket region 450 and/or a second pocket region 452. The first pocket region 450 and/or the second pocket region 452 may be formed by implanting a p-dopant in the silicon carbide of the counter-doped region 368 and/or the P-doped region 360. For example, a p-dopant such as aluminum may be implanted in the first pocket region 450 and/or the second pocket region 452. As described above, these pocket regions may act as a potential barrier to the electron flow.

The pocket regions 450, 452 of the silicon carbide trench transistor 401 may be formed between the N-wells 352 in the counter-doped region 368. The pocket regions 450, 452 may extend laterally beyond the counter-doped region 368. The N-wells 352 may also extend laterally beyond the pocket regions 450, 452. In some embodiments, the pocket regions 450, 452 may directly contact the N-wells 352, the counter-doped region 368, and/or the gate oxide 358 without any intervening layers therebetween. Other embodiments may allow small intervening layers.

Figure 5:
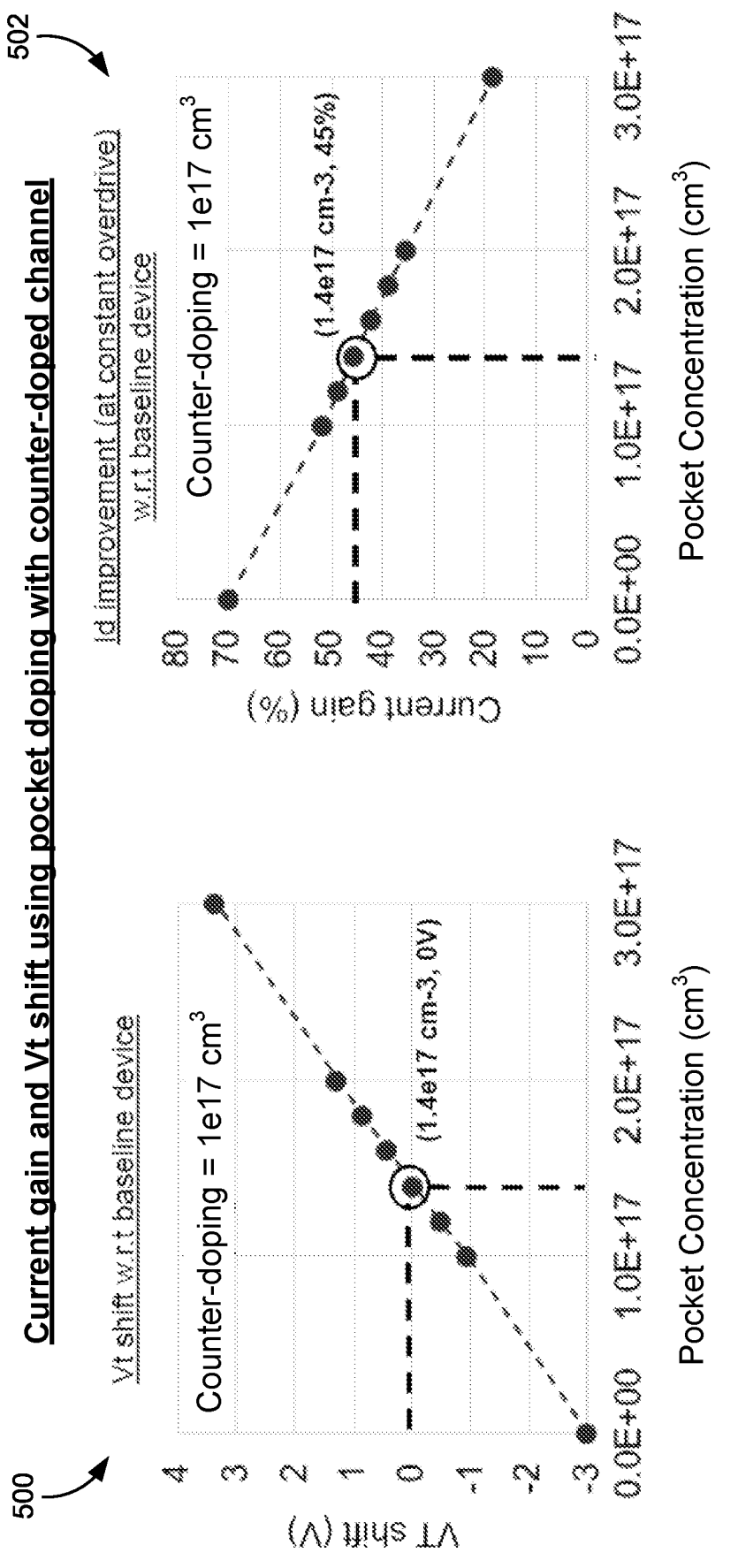
FIG. 5 illustrates graphs that show how adjusting the doping concentration of the pocket regions may affect the threshold voltage shift and current gain, according to some embodiments.

FIG. 5 illustrates graphs 500, 502 that show how adjusting the doping concentration of the pocket regions 402, 404 may affect the threshold voltage shift and current gain, according to some embodiments. As illustrated in these graphs 500, 502, increasing the doping concentration of the pocket regions 402, 404 may increase the threshold voltage shift while simultaneously decreasing the current gain. Various levels of doping concentrations for the pocket regions 402, 404 may be used to adjust the threshold voltage and/or current gain to a desired level. For example, some embodiments may use doping levels for the pocket regions of between about 1e17 cm$^3$ and about 2e17 cm$^3$, between about 2e17 cm$^3$ and about 3e17 cm$^3$, between about 3e17 cm$^3$ and about 4e17 cm$^3$, between about 4e17 cm$^3$ and about 5e17 cm$^3$, between about 5e17 cm$^3$ and about 6e17 cm$^3$, between about 6e17 cm$^3$ and about 7e17 cm$^3$, between about 7e17

$cm^3$ and about $8e17$ $cm^3$, between about $8e17$ $cm^3$ and about $9e17$ $cm^3$, between about $9e17$ $cm^3$ and about $1e18$ $cm^3$, and greater than about $1e18$ $cm^3$.

In some embodiments, the doping level of the pocket regions 402, 404 may be selected based on the desired threshold voltage shift. For example, graph 500 illustrates various doping levels for the pocket regions 402, 404 with a doping concentration of the counter-doped region 306 of about $1e17$ $cm^3$. Using graph 500, a doping concentration of about $1.4e17$ $cm^3$ may be selected in order to produce a threshold voltage shift of about 0.0 V. Graph 502 illustrates the corresponding current gain percentage as a function of the same doping concentration of the pocket regions 402, 404. For example, using the doping concentration of about $1.4e17$ $cm^3$ will produce a current gain of about 45%.

Some design methods may include increasing or decreasing the doping concentration of the pocket regions 402, 404 in order to select a desired threshold voltage shift and current gain. For example, a predetermined threshold voltage shift may be selected, and the corresponding doping concentration of the pocket regions 402, 404 may be selected from a data table or graph produced from experimental results or simulated results. Similarly, a predetermined current gain may be selected, and the corresponding doping concentration of the pocket regions 402, 404 may be selected from a data table or graph.

Figure 6:
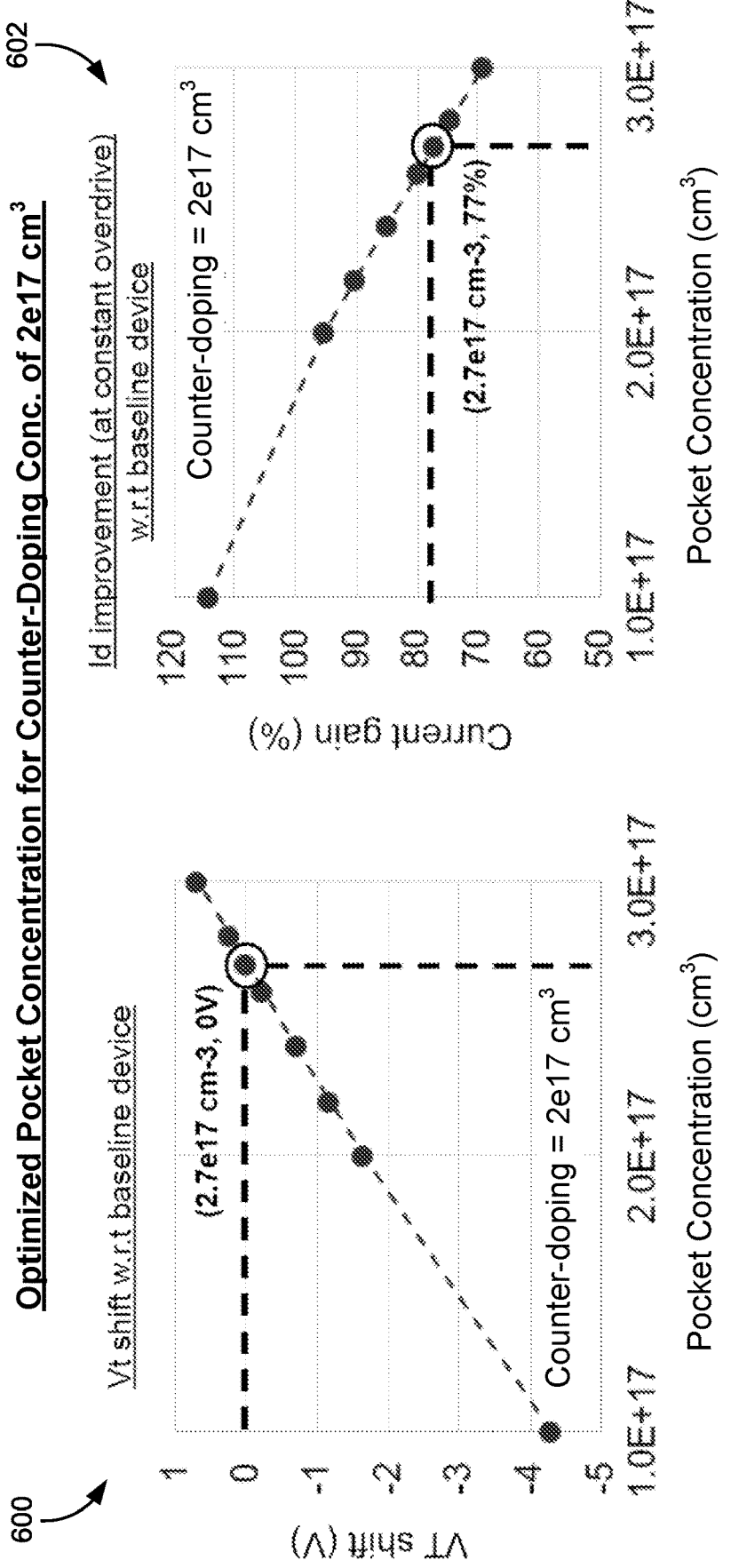
FIG. 6 illustrates graphs that show how adjusting the doping concentration of the counter-doped region may affect the threshold voltage shift and current gain, according to some embodiments.

FIG. 6 illustrates graphs 600, 602 that show how adjusting the doping concentration of the counter-doped region 306 may affect the threshold voltage shift and current gain, according to some embodiments. As illustrated in these graphs 600, 562, increasing the doping concentration of the counter-doped region may shift the voltage threshold and current gain illustrated above in FIG. 5. Various levels of doping concentrations for the counter-doped region 306 be used to adjust the threshold voltage and/or current gain to a desired level. Graphs 600, 602 illustrate threshold voltage and current gain as a function of the pocket doping concentration for a counter doping concentration of about $2e17$ $cm^3$. Other similar graphs or data sets may be generated for each doping concentration available for the counter-doped region. For example, some embodiments may use doping levels for the counter doped region 306 of between about $1e17$ $cm^3$ and about $2e17$ $cm^3$, between about $2e17$ $cm^3$ and about $3e17$ $cm^3$, between about $3e17$ $cm^3$ and about $4e17$ $cm^3$, between about $4e17$ $cm^3$ and about $5e17$ $cm^3$, between about $5e17$ $cm^3$ and about $6e17$ $cm^3$, between about $6e17$ $cm^3$ and about $7e17$ $cm^3$, between about $7e17$ $cm^3$ and about $8e17$ $cm^3$, between about $8e17$ $cm^3$ and about $9e17$ $cm^3$, between about $9e17$ $cm^3$ and about $1e18$ $cm^3$, and greater than about $1e18$ $cm^3$.

In some embodiments, the doping level of the counter-doped region 306 may be selected based on the desired threshold voltage shift or other performance characteristics of the silicon carbide transistor. For example, graph 600 illustrates how a counter-doped region concentration of $2e17$ $cm^3$ may produce an "always-ON" device. By increasing the doping concentration of the pocket regions 402, 404, a significant 77% current gain may be realized without shifting the threshold voltage significantly in graph 602.

Some design methods may include increasing or decreasing the doping concentration of the pocket regions 402, 404, and increasing or decreasing the doping concentration of the counter-doped region 306 in order to select a desired threshold voltage shift and current gain. For example, a predetermined threshold voltage shift may be selected, and the corresponding doping concentration of the pocket regions 402, 404 may be selected from a data table or graph produced from experimental results or simulated results for different levels of doping concentrations for the counter-doped region 306. Similarly, a predetermined current gain may be selected, and the corresponding doping concentration of the pocket regions 402, 404 may be selected from a data table or graph specific to the doping concentration of the counter-doped region 306.

Figure 7:
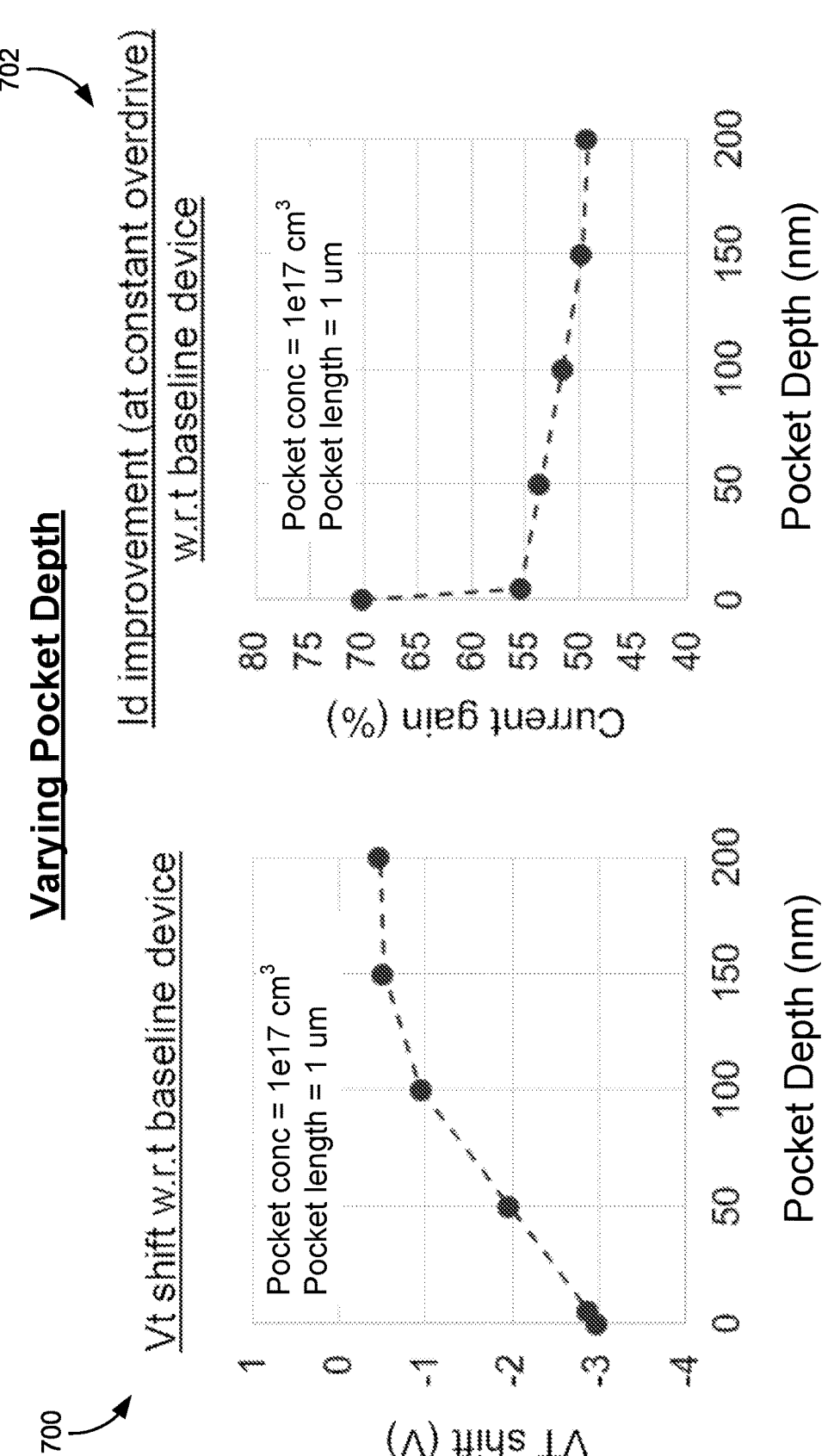
FIG. 7 illustrates graphs that show how adjusting the depth of the pocket regions may affect the threshold voltage shift and current gain, according to some embodiments.

FIG. 7 illustrates graphs 700, 702 that show how adjusting the depth of the pocket regions 402, 404 may affect the threshold voltage shift and current gain, according to some embodiments. As used here, the "depth" of the pocket regions 402, 404 refers to the depth in the vertical dimension illustrated in FIG. 4. As illustrated in these graphs 700, 702, increasing the depth of the pocket regions 402, 404 may increase the threshold voltage shift while simultaneously decreasing the current gain. Various depths for the pocket regions 402, 404 may be used to adjust the threshold voltage and/or current gain to a desired level. For example, some embodiments may use depths for the pocket regions of between about 0 nm and about 10 nm, between about 10 nm and about 20 nm, between about 20 nm and about 30 nm, between about 30 nm and about 40 nm, between about 40 nm and about 50 nm, between about 50 nm and about 60 nm, between about 60 nm and about 70 nm, between about 70 nm and about 80 nm, between about 80 nm and about 90 nm, between about 90 nm and about 100 nm, between about 100 nm and about 110 nm, between about 110 nm and about 120 nm, between about 120 nm and about 130 nm, between about 130 nm and about 140 nm, between about 140 nm and about 150 nm, between about 150 nm and about 160 nm, between about 160 nm and about 170 nm, between about 170 nm and about 180 nm, between about 180 nm and about 190 nm, between about 190 nm and about 00 nm, and greater than about 200 nm. As illustrated in graphs 700, 702, the best performance may be found within a pocket depth of less than about 100 nm in some embodiments. For example, lower pocket depths may result in more threshold voltage loss without a significant difference in the drive current due to partial depletion of the pocket regions. Optimal depth for the pocket regions may be dependent on the doping concentration of the counter doped region 306, and thus additional graphs or data sets may be generated for different concentrations of the pocket regions and/or counter-doped region based on the needs of each particular embodiment.

In some embodiments, the depth of the pocket regions 402, 404 may be selected based on the desired threshold voltage shift. For example, graph 700 illustrates various depth levels for the pocket regions 402, 404 with a doping concentration of about $1e17$ $cm^3$ and a pocket length of about 1 μm. Using graph 700, a depth may be selected in order to produce a desired threshold voltage shift. Graph 702 illustrates the corresponding current gain percentage as a function of the same depth of the pocket regions 402, 404. For example, using depth of about 100 nm will produce a current gain of about 52% with a threshold voltage shift of about −0.9 V.

Some design methods may include increasing or decreasing the depth of the pocket regions 402, 404 in order to select a desired threshold voltage shift and current gain. For example, a predetermined threshold voltage shift may be selected, and the corresponding depth of the pocket regions 402, 404 may be selected from a data table or graph produced from experimental results or simulated results. Similarly, a predetermined current gain may be selected, and the corresponding depth of the pocket regions 402, 404 may be selected from a data table or graph.

Figure 8:
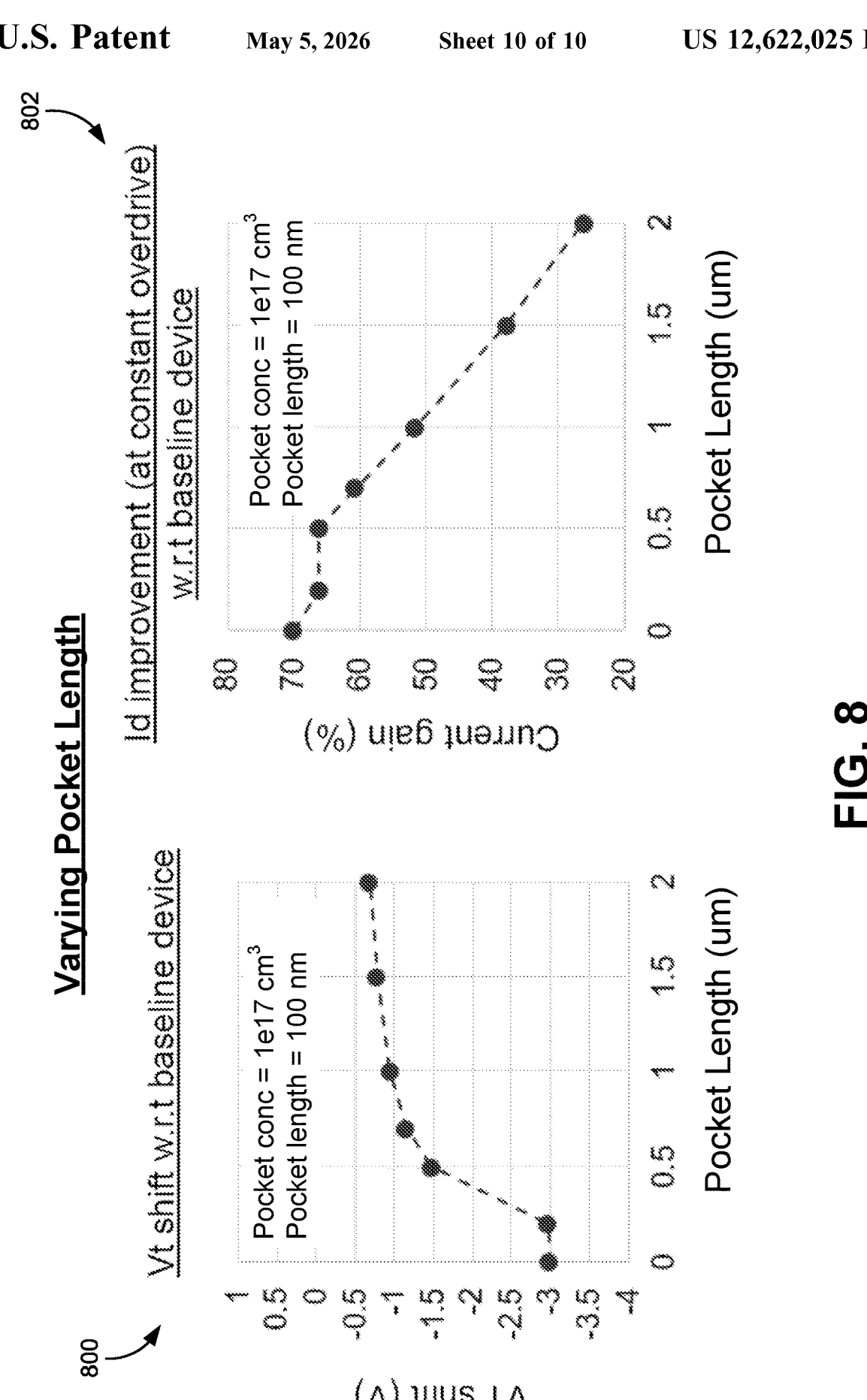
FIG. 8 illustrates graphs that show how adjusting the length of the pocket regions may affect the threshold voltage shift and current gain, according to some embodiments.

FIG. 8 illustrates graphs 800, 802 that show how adjusting the length of the pocket regions 402, 404 may affect the threshold voltage shift and current gain, according to some embodiments. As used here, the "length" of the pocket regions 402, 404 refers to the length in the horizontal dimension illustrated in FIG. 4A. As illustrated in these graphs 800, 802, increasing the length of the pocket regions 402, 404 may increase the threshold voltage shift while simultaneously decreasing the current gain. Various lengths for the pocket regions 402, 404 may be used to adjust the threshold voltage and/or current gain to a desired level. For example, some embodiments may use lengths for the pocket regions of between about 0.0 µm and about 0.1 µm, between about 0.1 µm and about 0.2 µm, between about 0.2 µm and about 0.3 µm, between about 0.3 µm and about 0.4 µm, between about 0.4 µm and about 0.5 µm, between about 0.5 µm and about 0.6 µm, between about 0.6 µm and about 0.7 µm, between about 0.7 µm and about 0.8 µm, between about 0.8 µm and about 0.9 µm, between about 0.9 µm and about 1.0 µm, 1.0 µm and about 1.1 µm, between about 1.1 µm and about 1.2 µm, between about 1.2 µm and about 1.3 µm, between about 1.3 µm and about 1.4 µm, between about 1.4 µm and about 1.5 µm, between about 1.5 µm and about 1.6 µm, between about 1.6 µm and about 1.7 µm, between about 1.7 µm and about 1.8 µm, between about 1.8 µm and about 1.9 µm, between about 1.9 µm and about 2.0 µm. As illustrated in graphs 800, 802, the best performance may be found within a pocket length depth of between about 0.5 µm and about 1.0 µm in some embodiments. At higher pocket lengths, the pocket doping may affect the device resistance more compared to the effect on the threshold voltage.

In some embodiments, the length of the pocket regions 402, 404 may be selected based on the desired threshold voltage shift. For example, graph 800 illustrates various length levels for the pocket regions 402, 404 with a doping concentration of about 1e17 cm³ and a pocket depth of about 100 nm. Using graph 800, a length may be selected in order to produce a desired threshold voltage shift. Graph 802 illustrates the corresponding current gain percentage as a function of the same length of the pocket regions 402, 404. For example, using length of about 1.0 µm will produce a current gain of about 52% with a threshold voltage shift of about −0.9 V.

Some design methods may include increasing or decreasing the length of the pocket regions 402, 404 in order to select a desired threshold voltage shift and current gain. For example, a predetermined threshold voltage shift may be selected, and the corresponding length of the pocket regions 402, 404 may be selected from a data table or graph produced from experimental results or simulated results. Similarly, a predetermined current gain may be selected, and the corresponding length of the pocket regions 402, 404 may be selected from a data table or graph.

As used herein, the terms "about" or "approximately" or "substantially" may be interpreted as being within a range that would be expected by one having ordinary skill in the art in light of the specification. For example, these terms may be interpreted as plus or minus 10% from a nominal value.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A silicon carbide transistor comprising:
a source region;
a drain region;
a gate oxide; and
a channel region between the source region and the drain region and beneath the gate oxide, wherein the channel region comprises:
a p-doped silicon carbide region that is doped at a concentration greater than about 1e18 $cm^3$;
a counter-doped region comprising n-doped silicon carbide, wherein the counter-doped region is between the p-doped silicon carbide region and the gate oxide; and
a first p-doped pocket region between the source region and the counter-doped region.

2. The silicon carbide transistor of claim 1, wherein the channel region further comprises:
a second p-doped pocket region between the drain region and the counter-doped region.

3. The silicon carbide transistor of claim 1, wherein the counter-doped region is doped at a concentration that is less than about 1e18 $cm^3$.

4. The silicon carbide transistor of claim 1, wherein the channel region has a length of about 10 $\mu m$.

5. The silicon carbide transistor of claim 1, wherein the counter-doped region and doping concentration of the p-doped silicon carbide region cause a threshold voltage of the silicon carbide transistor to increase by less than or about 3V.

6. The silicon carbide transistor of claim 1, wherein the counter-doped region and doping concentration of the p-doped silicon carbide region cause a drive current to increase by more than or about 70%.

7. A silicon carbide transistor comprising:
a source region;
a drain region;
a gate oxide; and
a channel region between the source region and the drain region and beneath the gate oxide, wherein the channel region comprises:
a p-doped silicon carbide region beneath the gate oxide;
a counter-doped region comprising n-doped silicon carbide, wherein the counter-doped region is between the p-doped silicon carbide region and the gate oxide;

a first p-doped pocket region between the source region and the counter-doped region; and
a second p-doped pocket region between the drain region and the counter-doped region.

8. The silicon carbide transistor of claim 7, wherein the p-doped silicon carbide region is doped at a concentration greater than about 1e18 $cm^3$.

9. The silicon carbide transistor of claim 7, wherein the first p-doped pocket region and the second p-doped pocket region contact the gate oxide.

10. The silicon carbide transistor of claim 7, wherein the first p-doped pocket region and the second p-doped pocket region do not contact the p-doped silicon carbide region.

11. The silicon carbide transistor of claim 7, wherein the first p-doped pocket region and the second p-doped pocket region have a vertical depth that is about half of a vertical depth of the counter-doped region.

12. The silicon carbide transistor of claim 7, wherein the first p-doped pocket region and the second p-doped pocket region have a horizontal length of between about 0.5 nm and about 2.0 nm.

13. The silicon carbide transistor of claim 7, wherein the first p-doped pocket region and the second p-doped pocket region have a vertical depth that is between about 0.5 $\mu m$ and about 1.0 $\mu m$.

14. The silicon carbide transistor of claim 7, wherein the first p-doped pocket region contacts the source region and the counter-doped region.

15. The silicon carbide transistor of claim 7, wherein the second p-doped pocket region contacts the drain region and the counter-doped region.

16. A method of forming a channel region for a silicon carbide transistor, the method comprising:
providing a silicon carbide layer;
implanting a p-dopant in the silicon carbide layer to form a p-doped region that is doped at a concentration greater than or about 1e18 $cm^3$ between a source region and a drain region;
implanting an n-dopant in the silicon carbide layer to form a counter-doped region comprising n-doped silicon carbide between the source region and the drain region, wherein the counter-doped region is on top of the p-doped region; and
implanting a first p-doped pocket region between the source region and the counter-doped region.

17. The method of claim 16, further comprising:
implanting a second p-doped pocket region between the drain region and the counter-doped region.

18. The method of claim 17, further comprising:
determining a length and depth of the first p-doped pocket region and the second p-doped pocket region to produce a target threshold voltage shift and drive current gain.

19. The method of claim 17, further comprising:
determining a doping concentration of the first p-doped pocket region and the second p-doped pocket region to produce a target threshold voltage shift and drive current gain.

* * * * *